US010685803B2

(12) United States Patent
Kupsch et al.

(10) Patent No.: US 10,685,803 B2
(45) Date of Patent: Jun. 16, 2020

(54) CIRCUIT BREAKER

(71) Applicant: Siemens Aktiengesellschaft, Munich (DE)

(72) Inventors: Alexander Kupsch, Berlin (DE); Andre Borgwardt, Schoenwalde-OT Paaren (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 476 days.

(21) Appl. No.: 15/685,025

(22) Filed: Aug. 24, 2017

(65) Prior Publication Data
US 2018/0114660 A1    Apr. 26, 2018

(30) Foreign Application Priority Data
Oct. 26, 2016    (DE) .................... 10 2016 221 093

(51) Int. Cl.
| | |
|---|---|
| *H01H 71/02* | (2006.01) |
| *H05K 5/06* | (2006.01) |
| *H05K 7/14* | (2006.01) |
| *H01H 71/12* | (2006.01) |
| *H01H 71/74* | (2006.01) |

(52) U.S. Cl.
CPC ........ *H01H 71/025* (2013.01); *H01H 71/123* (2013.01); *H01H 71/74* (2013.01); *H05K 5/06* (2013.01); *H05K 7/1468* (2013.01); *H05K 7/1484* (2013.01); *H01H 2071/7472* (2013.01)

(58) Field of Classification Search
CPC .... H01H 71/025; H01H 71/123; H01H 71/74; H01H 2071/7472; H05K 5/06; H05K 7/1468; H05K 7/1484

USPC ........................................................ 361/115
See application file for complete search history.

(56) References Cited

U.S. PATENT DOCUMENTS

| | | | | |
|---|---|---|---|---|
| 4,323,747 | A | * | 4/1982 | Takase ...................... F16P 3/08 126/197 |
| 4,870,531 | A | | 9/1989 | Danek |
| 4,945,443 | A | | 7/1990 | DeBiasi et al. |

(Continued)

FOREIGN PATENT DOCUMENTS

| | | |
|---|---|---|
| CN | 2178938 Y | 10/1994 |
| CN | 1911166 A | 2/2007 |

(Continued)

OTHER PUBLICATIONS

German Office Action dated Feb. 8, 2018.
(Continued)

*Primary Examiner* — Zeev V Kitov
(74) *Attorney, Agent, or Firm* — Harness, Dickey & Pierce, P.L.C.

(57) ABSTRACT

A circuit breaker is for interrupting an electric circuit if settable protective parameters are exceeded. In an embodiment, the circuit breaker includes an electronic trip unit, in which the set protective parameters are stored, with a movable sealing pane, which covers at least part of the circuit breaker. The circuit breaker further includes a sensor with which a first state of the sealing pane can be ascertained. The electronic trip unit is designed such that changes to the protective parameters are accepted by the electronic trip unit only in the first state of the sealing pane.

24 Claims, 6 Drawing Sheets

(56) References Cited

U.S. PATENT DOCUMENTS

| | | |
|---|---|---|
| 5,544,959 A | 8/1996 | Collin et al. |
| 6,603,648 B1 | 8/2003 | Ette et al. |
| 2007/0038134 A1 | 2/2007 | Sawanoi et al. |

FOREIGN PATENT DOCUMENTS

| | | |
|---|---|---|
| CN | 201142308 Y | 10/2008 |
| CN | 201508811 U | 6/2010 |
| CN | 202332749 U | 7/2012 |
| CN | 203414750 U | 1/2014 |
| DE | 19820173 C1 | 9/1999 |

OTHER PUBLICATIONS

Chinese Office Action and English translation thereof dated Sep. 17, 2019.
Chinese Office Action and English translation thereof dated Nov. 21, 2018.

\* cited by examiner

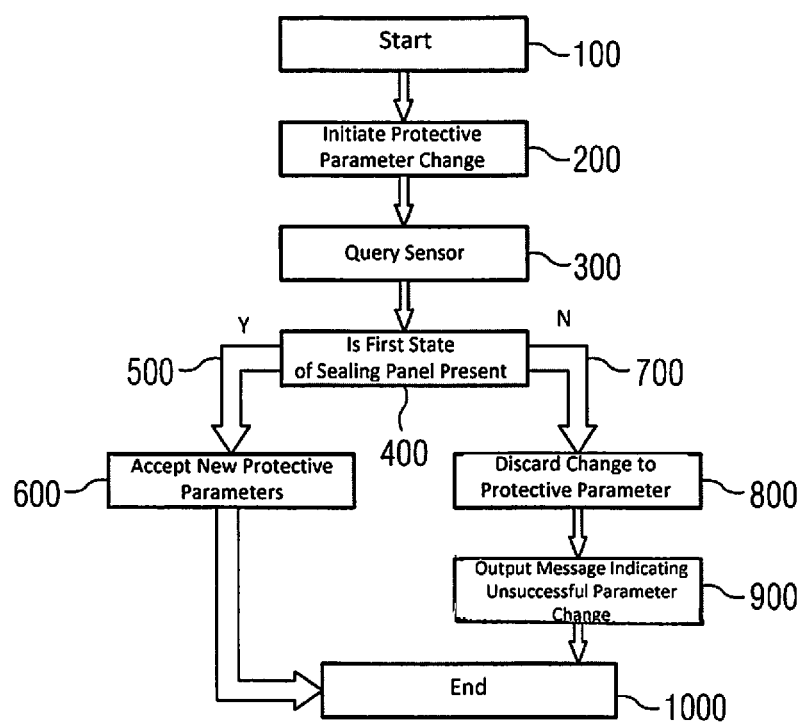

CIRCUIT BREAKER

PRIORITY STATEMENT

The present application hereby claims priority under 35 U.S.C. § 119 to German patent application number DE 102016221093.9 filed Oct. 26, 2016, the entire contents of which are hereby incorporated herein by reference.

FIELD

At least one embodiment of the invention generally relates to a circuit breaker and/or a method for a circuit breaker.

BACKGROUND

Circuit breakers are protective devices which operate like a fuse. Circuit breakers monitor the current flowing therethrough via a conductor and interrupt the electric current/the energy flow to an energy sink/a consumer, which is called tripping, if protective parameters such as current limit values or current-timespan limit values are exceeded, wherein a current-timespan limit value is understood to mean a current value which is present for a certain timespan. Interruption is effected for example by way of circuit breaker contacts, which are opened.

In particular, for low-voltage circuits or networks various types of circuit breakers are known depending on the level of the provided electric current in the electric circuit. Circuit breakers in terms of the embodiments of the present application are in particular understood to be switches as used in low-voltage systems for currents from 63 to 6300 Ampere. In particular, closed circuit breakers are used for currents from 63 to 1600 Ampere, in particular from 125 to 630 or 1200 Ampere. Open circuit breakers are used in particular for currents from 630 to 6300 Ampere, more particularly from 1200 to 6300 Ampere.

Open circuit breakers are also called air circuit breakers, ACB for short, and closed circuit breakers are called molded case circuit breaker or compact circuit breaker, MCCB for short.

Low-voltage is understood to mean in particular voltages up to 1000 Volt alternating current or 1500 Volt direct current.

Circuit breakers in terms of the embodiments of the present application are understood, in particular, to mean circuit breakers with an electronic trip unit called ETU for short.

If current flow is excessively "high", circuit breakers interrupt the circuit in accordance with their protective parameters or response values. The protective parameters/response values basically denote the level of the current and the time after which the circuit is to be interrupted if the current flow is continually "high". In contrast to a fuse, these protective parameters/response values can be set for a circuit breaker, for example by way of the electronic trip unit. The trip unit is usually attached so that it is accessible via the front of the circuit breaker. The protective parameters can be set or parameterized via this trip unit. Often rotary encoding switches are used for setting the protective parameters/parameterization, and these are attached at the front of the electronic trip unit.

The protective parameters which can be set via these rotary encoding switches are those which decisively determine the trip times or/and trip currents. An inadvertent or deliberate alteration of these settings by unauthorized persons can have serious consequences for the protection of the electric circuit/the operated electrical system. It is, for example, possible that the required protection may have been undone leading to the destruction of system components.

In order to prevent changes to the protective parameters, a sealing pane is provided which covers at least part of the circuit breaker and, in particular, protects the rotary encoding switches against unauthorized access. A mechanical protection against changes to the protective parameters is thus realized. The sealing pane is secured by a seal.

An electronic trip unit may also be provided with a display and with communications ports such as CAN. Further a testing device, for example, may be connected. In the meantime, a change to the protective parameters can also be made via these interfaces. According to the state of the art a change to the protective parameters is secured in this case by a password.

SUMMARY

At least one embodiment of the present invention is directed to an improved circuit breaker.

At least one embodiment is directed to a circuit breaker and/or a method for a circuit breaker.

According to at least one embodiment of the invention, a circuit breaker comprises a sensor with which a first state of the sealing pane can be ascertained. Further the electronic trip unit is designed such that changes to the protective parameters are accepted by the electronic trip unit only in the first state of the sealing pane.

According to at least one embodiment of the invention, a method is disclosed for a circuit breaker for interrupting an electric circuit if settable protective parameters are exceeded. Protective parameters which are set in the circuit breaker are stored and a movable sealing pane is provided. The method includes ascertaining a first state of the sealing pane; and accepting changes to the stored protective parameters, via at least one of the circuit breaker and an electrical control unit of the circuit breaker, only in the ascertained first state of the sealing pane.

BRIEF DESCRIPTION OF THE DRAWINGS

The described properties, features and advantages of this invention as well as the way in which these are achieved become clearer and are understood better in conjunction with the description hereunder of the embodiments, which are explained in more detail with reference to the drawings, in which
FIG. 8 shows a flow diagram of the method according an embodiment of the invention.

DETAILED DESCRIPTION OF THE EXAMPLE EMBODIMENTS

Figure 1:
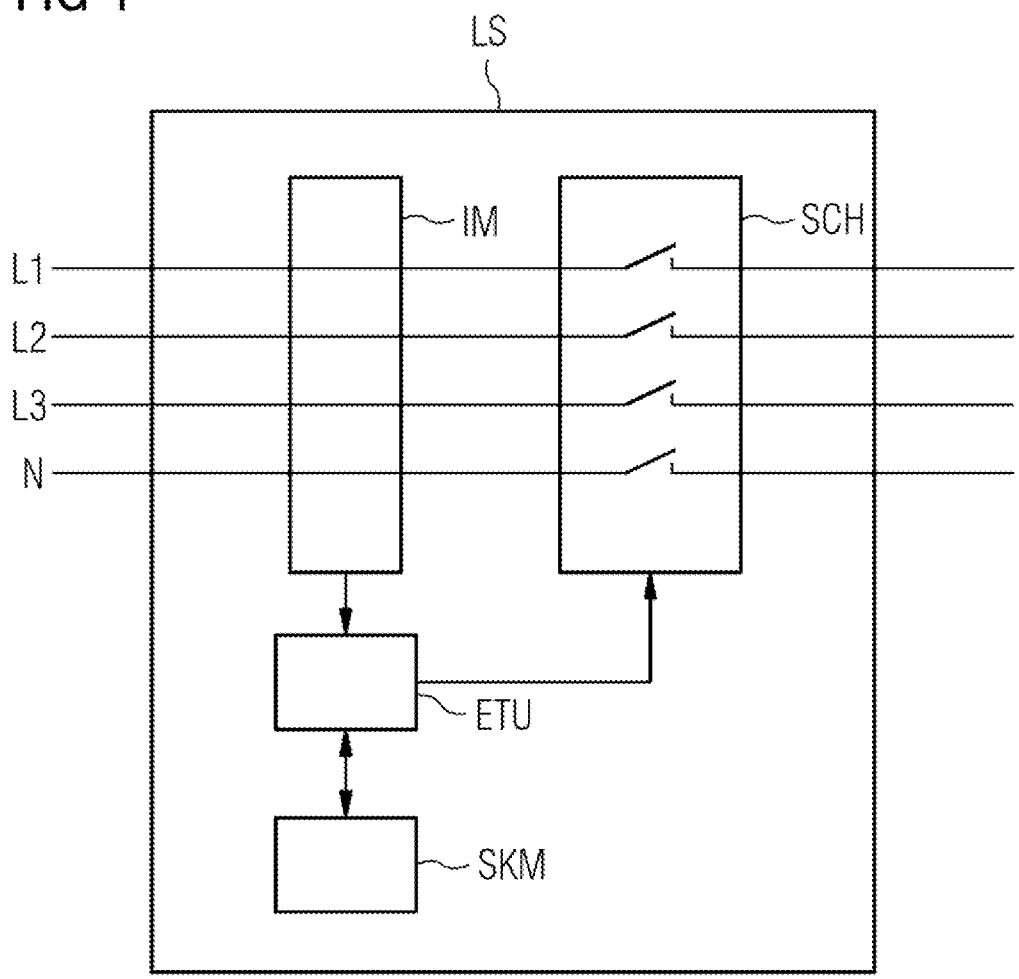
FIG. 1 shows a functional block view of a circuit breaker.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the invention, a circuit breaker comprises a sensor with which a first state of the sealing pane can be ascertained. Further the electronic trip unit is designed such that changes to the protective parameters are accepted by the electronic trip unit only in the first state of the sealing pane.

A special advantage of at least one embodiment is that changes made to the protective parameters, in particular by external devices connected to the circuit breaker such as testing devices, can be effected only when the sealing pane is in a first state. Thus a change to the protective parameters can be made only by authorized persons who are allowed to carry out the sealing operation.

A first state of the sealing pane may be an open state of the sealing pane. A second state may be a closed state of the sealing pane, in which this is normally sealed.

If no seal has been fitted to the sealing pane it must be assumed that the protective parameters have been manipulated because it is possible that the sealing pane was opened in order to change the protective parameters. A respective state can be quickly recognized and measures be taken (for example checking the protective parameters, sealing of the sealing pane).

Advantageous further developments of the invention are cited in the claims.

In one advantageous configuration of at least one embodiment of the invention, the electronic trip unit comprises a memory and a control unit which is connected to the sensor and is designed in such a way that a change to the protective parameters in the memory by the control unit is granted only in the first state of the sealing pane.

A special advantage of this at least one embodiment is that the function according to the invention is realized by the control unit in the electronic trip unit, so that existing units can be used.

In one advantageous configuration of at least one embodiment of the invention the sealing pane covers at least part of the electronic trip unit.

A special advantage of this at least one embodiment is that for example only one type of interface elements is covered such as rotary encoding switches for setting the protective parameters, whilst another type of interface elements is freely accessible.

In one advantageous configuration of at least one embodiment of the invention at least part of the sealing pane is transparent or is made of transparent material.

A special advantage of this at least one embodiment is that for example values set for the protective parameters are visible through the sealing pane.

In one advantageous configuration of at least one embodiment of the invention, the sensor is arranged in the electronic trip unit (ETU).

A special advantage of this at least one embodiment of is that it allows an especially compact realization.

In one advantageous configuration of at least one embodiment of the invention, a sensor unit is provided which ascertains parameters of the electric circuit and is connected to the electronic trip unit (ETU), and a contact unit is provided which is connected to the electronic trip unit (ETU) and can interrupt the electric circuit by means of electrical contacts.

A special advantage of this at least one embodiment is that all units of a circuit breaker are realized in one device.

In one advantageous configuration of at least one embodiment of the invention the sensor comprises an electrical switch or push button.

A special advantage of this at least one embodiment is that it allows an especially simple realization.

In one advantageous configuration of at least one embodiment of the invention, the sensor comprises a reed contact.

A special advantage of this at least one embodiment is that a contactless and especially secure realization is possible in that open mechanical switching elements are avoided.

In one advantageous configuration of at least one embodiment of the invention the sensor comprises a capacitive sensor.

A special advantage of this at least one embodiment is that a contactless and purely electronic realization for a sensor is possible in that mechanical contacts are altogether avoided.

In one advantageous configuration of at least one embodiment of the invention the sensor comprises a light barrier.

A special advantage of this at least one embodiment is that another kind of contactless and electronic realization for a sensor is possible in that mechanical contacts are altogether avoided.

In one advantageous configuration of at least one embodiment of the invention, the sensor cooperates with an actuator, which is arranged on the sealing pane.

A special advantage of this at least one embodiment is that it results in a defined actuator-sensor-combination for the avoidance of manipulations.

In one advantageous configuration of at least one embodiment of the invention the actuator is a tappet.

A special advantage of this at least one embodiment is that the actuator is very simple.

In one advantageous configuration of at least one embodiment of the invention the actuator is a magnet.

A special advantage of this at least one embodiment is that the actuator is simple and contactless.

In one advantageous configuration of at least one embodiment of the invention the actuator is a field-influencing element.

A special advantage of this at least one embodiment is that the actuator is contactless.

All designs both in a dependent form related back to the patent claim as well as related back merely to individual features or feature combinations of patent claims, result in an improvement of the circuit breaker.

FIG. 1 shows a function block diagram of a circuit breaker LS for an electric circuit/a circuit system, in the the example for a 3-phase system with conductors L1, L2, L3 and N which are connected to the circuit breaker LS and the current of which flows through the circuit breaker LS. A sensor unit IM is provided in the circuit breaker LS, which ascertains parameters of the electric circuit such as the electric current or/and the voltage or/and the frequency etc.

The sensor unit IM is connected to an electronic trip unit ETU, which determines whether protective parameters have been exceeded. Protective parameters may be current or/and current-time limit values or/and voltage limit values or/and their mathematical links.

The electronic trip unit ETU is connected to a contact unit SCH for interrupting the electric current of the electric circuit/circuit system.

If the electronic trip unit ETU detects that parameters such as measured values of the sensor unit IM have been exceeded, i.e. if the parameters or variables derived from the measured values exceed protective parameters/limit values, a signal is transmitted to the switching unit SCH, which thereupon interrupts the electric circuit, for example by opening switching contacts of the electric circuit.

The electronic trip unit ETU may be connected to other units such as a unit SKM.

Figure 2:
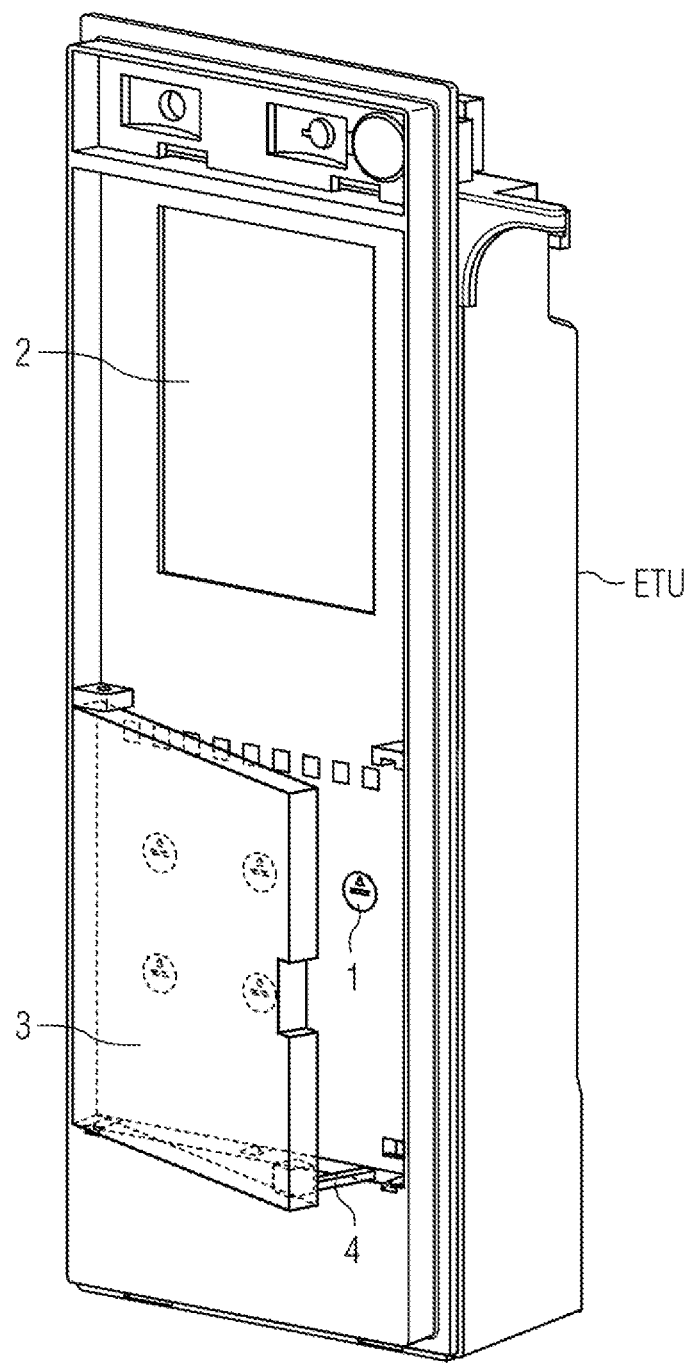
FIG. 2 shows a first view of an electronic trip unit.

FIG. 2 shows an electronic trip unit ETU for a circuit breaker LS. This trip unit may, for example, be able to be inserted into the housing of a circuit breaker LS so that the front of the electronic trip unit ETU is accessible from the front of a circuit breaker/is part of its front.

The electronic trip unit ETU comprises, for example, at least one display 2 such as for the display or/and input of information; at least one rotary encoding switch 1 for setting protective parameters; and at least one sealing pane 3 which covers at least part of the circuit breaker or/and the electronic trip unit ETU and which may be at least partly transparent.

According to an embodiment of the invention, the sealing pane 3 comprises an actuator 4. According to FIG. 2 this may be implemented as a tappet.

A sealing device for sealing the sealing pane 3 is not shown in the figures. At any rate, such sealing devices are known to the expert.

Figure 3:
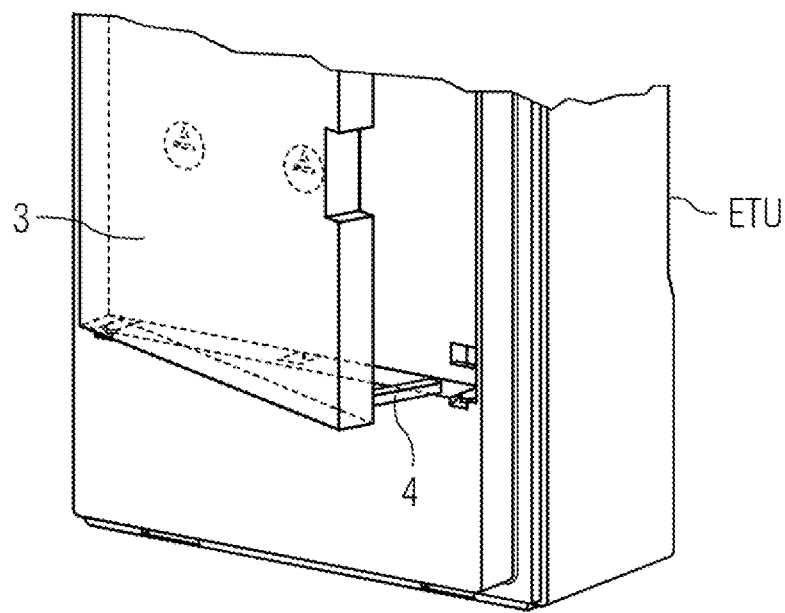
FIG. 3 shows a first detail view as per FIG. 2.

FIG. 3 shows a first detail view of FIG. 2, wherein the sealing pane/sealing door 3 and the actuator 4 implemented as a tappet, are shown in more detail.

Figure 4:
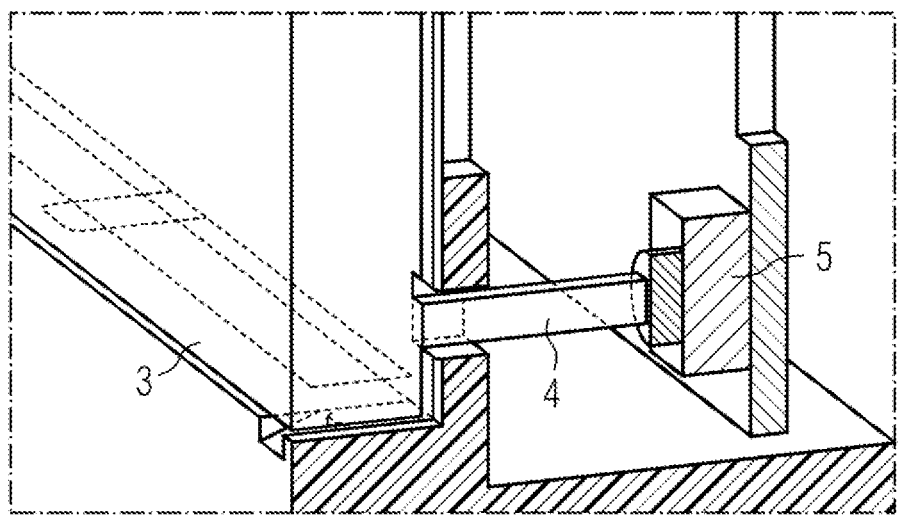
FIG. 4 shows a second detail view as per FIGS. 2 and 3.

FIG. 4 shows a second detail view of FIGS. 2 and 4, the difference being that the electronic trip unit ETU comprises a sensor 5.

This may, for example, be implemented as a push button/switching contact which cooperates with the actuator 4, e.g. the tappet. Similarly the sensor 5 may be implemented as a capacity sensor which reacts to the increased capacity through the actuator 4.

Figure 5:
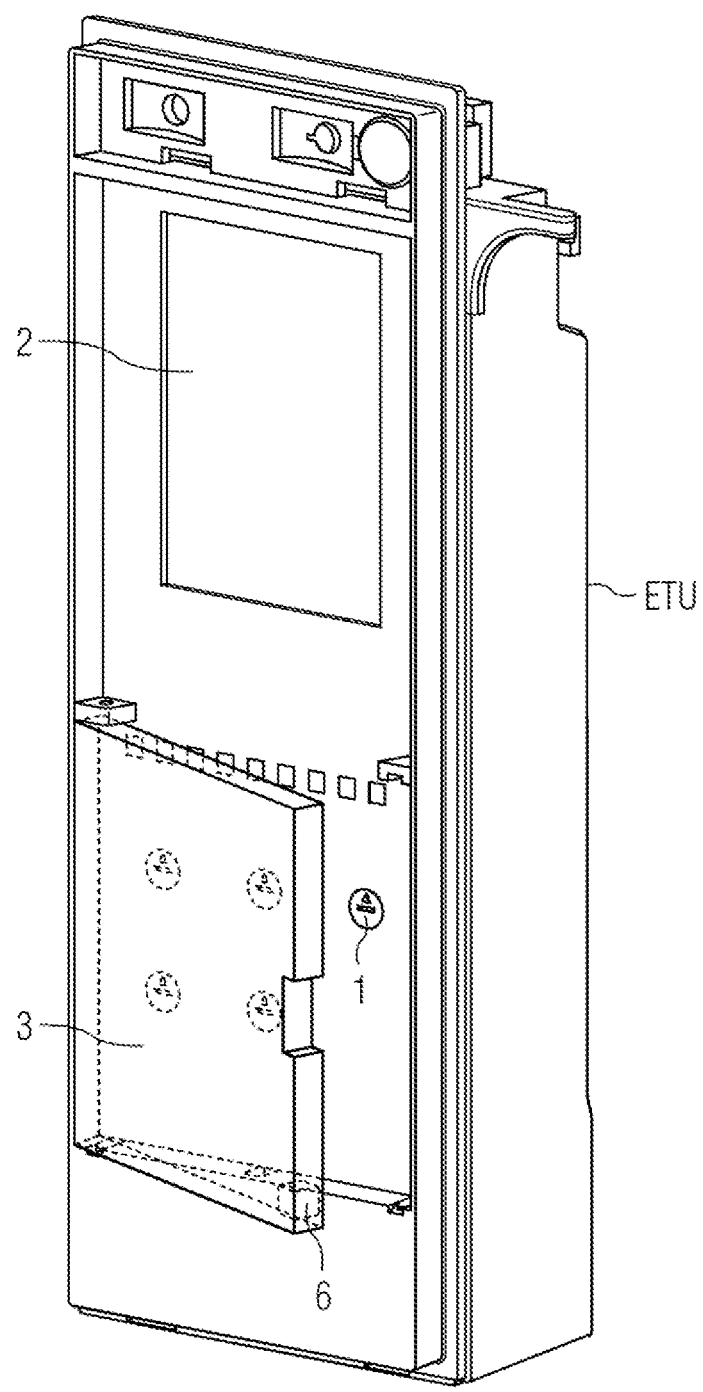
FIG. 5 shows a further detail view as per FIG. 2.

FIG. 5 shows a further view of FIG. 2, wherein the actuator 4 on the sealing pane, which is implemented as a transparent sealing door, is implemented as a magnet 6.

Figure 6:
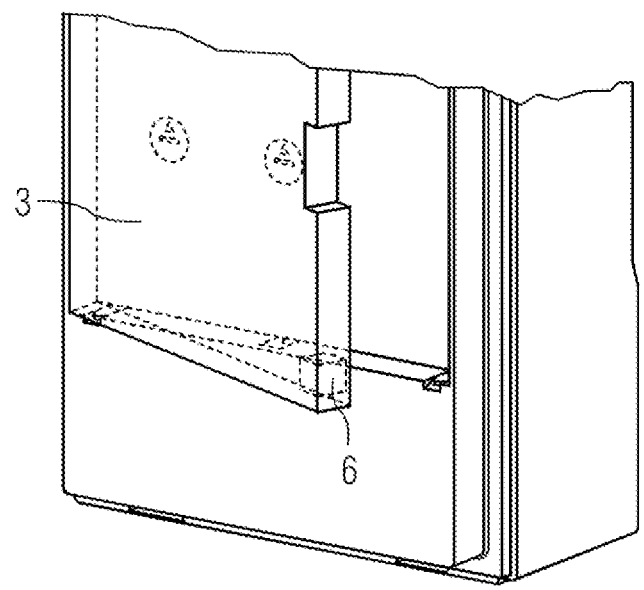
FIG. 6 shows a third detail view as per FIG. 5.

FIG. 6 shows a third detail view of FIG. 5, with a magnet 6 as actuator 4. The magnet 6 is arranged in a corner of the sealing pane 7, in particular in the lower corner of the sealing pane 3, which is remote from the hinge.

Figure 7:
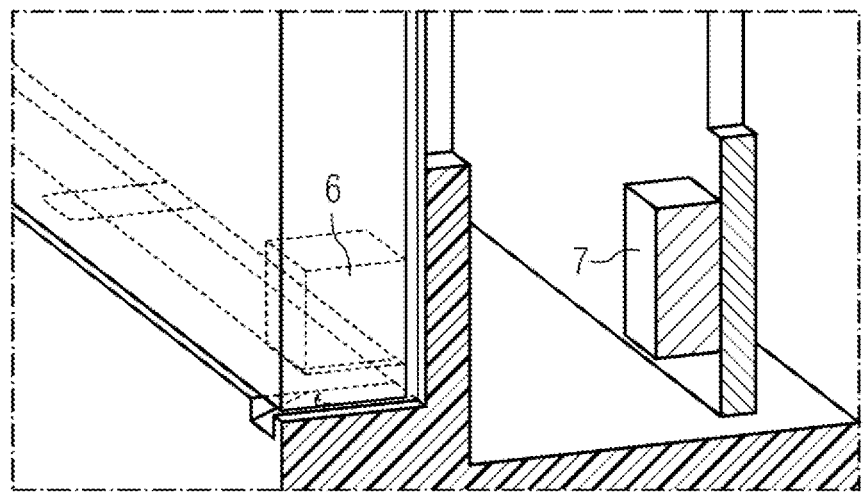
FIG. 7 shows a fourth detail view as per FIGS. 6 and 4.

FIG. 7 shows a fourth detail view of FIG. 6 or 4, the difference being that the sensor 5 is implemented as a reed relay 7. The sensor 5 could also be implemented as a Hall effect sensor, which reacts to a magnetic field. The reed relay 7/a Hall effect sensor cooperates with the actuator 6 implemented as a magnet.

When the sealing pane is open, this first state of the sealing pane is ascertained with the aid of the sensor. When the sealing pane is closed, a second state is ascertained, in which changes to the protective parameters are not possible or are rejected. This may be effected via further signals such as acoustic or optical information output by the electronic trip unit/the circuit breaker.

FIG. 8 shows a flow diagram of the method according to an embodiment of the invention.

Step 100 signifies the start of the method according to an embodiment of the invention. When a protective parameter change is initiated in step 200, the sensor is queried in step 300 as to whether a first state of the sealing pane such as "open" is present.

In step 400 it is checked whether the first state of the sealing pane is present. If this is the case (step 500), the new protective parameters are accepted in step 600, for example in the electronic trip unit ETU/the circuit breaker LS.

Thus in this case 500/600 the end of the method would be reached in step 1000.

If in step 400 the first state is not present, step 700, a change to the protective parameters is discarded in step 800. In step 900 a message can be output, e.g. acoustically or optically, that the protective parameter change was not successful. Thereafter in step 1000 the end of the method is reached which method is optionally repeated.

An embodiment of the invention will now be explained once more, but in other words.

If a change in the protective parameters of the circuit breaker is initiated in the circuit breaker/its electronic trip unit ETU/its electronic control unit, which for example may be effected via an input on the display 2 or via a connected test unit, a check is carried out prior to accepting the changed parameters, as to whether the sealing pane 3 is open or closed, i.e. is in the first state. This is effected via a sensor 5, which is for example excited by an actuator 4 e.g. in the closed state of the sealing pane 3. In other words, if the sensor 5 is excited, the sealing pane 3 is in the second state. If the sensor 5 is not excited, the sealing pane 3 is in the first state.

In this scenario the actuator 4 may be a "tappet" on the sealing pane, which plunges e.g. into the housing of the electronic trip unit ETU and excites the sensor 5 in the closed state of the sealing pane.

This sensor could for example be a switch or push button which is actuated. Alternatively it could be a light barrier which is interrupted.

A further option would be a contactless process, in which the actuator 4, 6 consists for example of a magnet or another field-influencing element, which is fastened in/on the sealing pane and in the closed state of the sealing pane excites the sensor 5, 7 such as a reed relay or a capacity sensor situated e.g. below the housing.

When the sensor 5, 7 emits a signal that the sealing pane is closed, i.e. is not in the first state, a change of the protective parameters is not granted. Thus a change in the protective parameters/protective settings through unauthorised persons is prevented.

The parameterization of a circuit breaker is thus protected to a high degree against manipulation.

Furthermore messages can be output, e.g. optically, acoustically, wire-bound or/and wirelessly, when the sealing pane is in the first state, e.g. is being opened in order to signal access.

Furthermore, if the sealing pane is open, the background lighting of a display of the circuit breaker/the electronic trip unit can be switched on, for example.

If setting the protective parameters on the electronic trip unit/the circuit breaker is effected contactlessly, the housing of the circuit breaker is almost totally closed and protected against external influences (ESD, liquids, dirt, . . . ). In this way problems with mechanical rotary encoding switches can be prevented whilst still providing protection against unauthorized access.

Although the invention has been illustrated and described in detail by way of the exemplary embodiment, the invention is not limited by the disclosed examples, and the expert may derive other variations from these without departing from the protective scope of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit breaker capable of interrupting an electric circuit in response to protective parameters being exceeded, comprising:
    an electronic trip unit, to store a set of the protective parameters; and
    a movable sealing pane, to cover at least part of the circuit breaker; and
    a sensor, to ascertain a first state of the sealing pane, the electronic trip unit being designed such that changes to the stored set of protective parameters are accepted by the electronic trip unit only in the first state of the sealing pane.

2. The circuit breaker of claim 1, wherein the electronic trip unit comprises a memory and a control unit, connectable to the sensor and designed such that a change to the set of protective parameters in the memory, via the control unit, is granted only in the first state of the sealing pane.

3. The circuit breaker of claim 1, wherein the sealing pane is configured to cover at least part of the electronic trip unit.

4. The circuit breaker of claim 1, wherein at least a part of the sealing pane is transparent or is made of transparent material.

5. The circuit breaker of claim 1, wherein the sensor is arranged in the electronic trip unit.

6. The circuit breaker of claim 1, wherein a sensor unit is provided, to ascertain parameters of the electric circuit and is connectable to the electronic trip unit, and wherein a contact unit is provided, connectable to the electronic trip unit and configured to interrupt the electric circuit by way of electrical contacts.

7. The circuit breaker of claim 1, wherein the set of protective parameters include at least one of current values and current-time limit values.

8. The circuit breaker of claim 1, wherein the first state of the sealing pane is an open state.

9. The circuit breaker of claim 1, wherein the sensor comprises an electric switch or push button.

10. The circuit breaker of claim 1, wherein the sensor comprises a reed contact.

11. The circuit breaker of claim 1, wherein the sensor comprises a capacitive sensor.

12. The circuit breaker of claim 1, wherein the sensor comprises a light barrier.

13. The circuit breaker of claim 1, wherein the sensor is configured to cooperate with an actuator, arranged on the sealing pane.

14. The circuit breaker of claim 13, wherein the actuator is a tappet.

15. The circuit breaker of claim 13, wherein the actuator is a magnet.

16. The circuit breaker of claim 13, wherein the actuator is a field-influencing element.

17. A method for a circuit breaker, configured to interrupt an electric circuit if settable protective parameters are exceeded, the protective parameters being stored and a movable sealing pane being provided, the method comprising:
    ascertaining a first state of the sealing pane; and
    accepting changes to the stored protective parameters, via at least one of the circuit breaker and an electrical control unit of the circuit breaker, only in the ascertained first state of the sealing pane.

18. The circuit breaker of claim 2, wherein the sealing pane is configured to cover at least part of the electronic trip unit.

19. The circuit breaker of claim 2, wherein at least a part of the sealing pane is transparent or is made of transparent material.

20. The circuit breaker of claim 2, wherein a sensor unit is provided, to ascertain parameters of the electric circuit and is connectable to the electronic trip unit, and wherein a contact unit is provided, connectable to the electronic trip unit and configured to interrupt the electric circuit by way of electrical contacts.

21. The circuit breaker of claim 2, wherein the sensor is configured to cooperate with an actuator, arranged on the sealing pane.

22. The circuit breaker of claim 21, wherein the actuator is a tappet.

23. The circuit breaker of claim 21, wherein the actuator is a magnet.

24. The circuit breaker of claim 21, wherein the actuator is a field-influencing element.

* * * * *